United States Patent
Udagawa

(10) Patent No.: US 7,598,593 B2
(45) Date of Patent: Oct. 6, 2009

(54) N-TYPE OHMIC ELECTRODE FOR N-TYPE GROUP III NITRIDE SEMICONDUCTOR, SEMICONDUCTOR LIGHT-EMITTING DEVICE WITH THE ELECTRODE, AND METHOD FOR FORMING N-TYPE OHMIC ELECTRODE

(75) Inventor: Takashi Udagawa, Chichibu (JP)

(73) Assignee: Showa Denko K.K., Tokyo (JP)

( * ) Notice: Subject to any disclaimer, the term of this patent is extended or adjusted under 35 U.S.C. 154(b) by 596 days.

(21) Appl. No.: 10/561,438

(22) PCT Filed: Jul. 16, 2004

(86) PCT No.: PCT/JP2004/010556

§ 371 (c)(1),
(2), (4) Date: Dec. 20, 2005

(87) PCT Pub. No.: WO2005/008757

PCT Pub. Date: Jan. 27, 2005

(65) Prior Publication Data

US 2007/0108453 A1    May 17, 2007

Related U.S. Application Data

(60) Provisional application No. 60/489,108, filed on Jul. 23, 2003.

(30) Foreign Application Priority Data

Jul. 16, 2003    (JP) ............................. 2003-197927

(51) Int. Cl.
   *H01L 23/58*    (2006.01)
   *H01L 29/06*    (2006.01)
   *H01G 5/06*    (2006.01)

(52) U.S. Cl. ...................... 257/573; 257/605; 257/657; 361/298; 29/740

(58) Field of Classification Search ................. 257/573, 257/605, 657, FOR. 354, 357; 361/298.4, 361/301.4, 303, 305, 321.4; 29/746
See application file for complete search history.

(56) References Cited

U.S. PATENT DOCUMENTS

| | | | | |
|---|---|---|---|---|
| 5,903,055 | A | * | 5/1999 | Takayama .................... 257/771 |
| 5,907,470 | A | * | 5/1999 | Kita et al. .................... 361/311 |
| 6,218,206 | B1 | * | 4/2001 | Inoue et al. .................... 438/30 |
| 6,252,247 | B1 | * | 6/2001 | Sakata et al. .................. 257/57 |
| 6,611,004 | B2 | | 8/2003 | Morimoto |

(Continued)

FOREIGN PATENT DOCUMENTS

CN    1424776 A    6/2003

(Continued)

*Primary Examiner*—Howard Weiss
*Assistant Examiner*—Steven H Rao
(74) *Attorney, Agent, or Firm*—Sughrue Mion, PLLC

(57) ABSTRACT

The present invention provides a constitution of n-type ohmic electrode suitable for n-type group III nitride semiconductor, and a forming method thereof for providing low contact resistivity. The n-type ohmic electrode is provided to comprise an alloy of aluminum and lanthanum or comprises lanthanum at the junction interface with the n-type group III nitride semiconductor. The method comprising forming a lanthanum-aluminum alloy layer at 300° C. or less to form an n-type ohmic electrode enriched in lanthanum at the junction interface.

9 Claims, 6 Drawing Sheets

U.S. PATENT DOCUMENTS

| | | | |
|---|---|---|---|
| 6,867,108 B2 * | 3/2005 | Jeong et al. | 438/384 |
| 7,037,766 B2 * | 5/2006 | Maeda et al. | 438/149 |
| 2002/0000558 A1 | 1/2002 | Morimoto | |
| 2002/0163302 A1 | 11/2002 | Nitta et al. | |
| 2003/0116774 A1 | 6/2003 | Yamamoto et al. | |
| 2007/0023777 A1 * | 2/2007 | Sonobe et al. | 257/103 |
| 2007/0278497 A1 * | 12/2007 | Kawakami et al. | 257/79 |

FOREIGN PATENT DOCUMENTS

| | | |
|---|---|---|
| EP | 1 249 873 A2 | 10/2002 |
| EP | 1249873 A2 | 10/2002 |
| JP | 2003-31895 A | 1/2003 |
| TW | 503591 | 9/2002 |

* cited by examiner

N-TYPE OHMIC ELECTRODE FOR N-TYPE GROUP III NITRIDE SEMICONDUCTOR, SEMICONDUCTOR LIGHT-EMITTING DEVICE WITH THE ELECTRODE, AND METHOD FOR FORMING N-TYPE OHMIC ELECTRODE

CROSS-REFERENCE TO RELATED APPLICATIONS

This application claims benefit of U.S. Provisional Application 60/489,108 filed Jul. 23, 2003, incorporated herein by reference, under 35 U.S.C. § 111(b) pursuant to 35 U.S.C. § 119(e)(1).

TECHNICAL FIELD

The present invention relates to an n-type ohmic electrode provided to contact with the surface of an n-type Group III nitride semiconductor layer, a semiconductor light-emitting device equipped with the electrode, and a method for forming the n-type ohmic electrode.

RELATED ART

Conventionally, Group III nitride semiconductors represented, for example, by the formula $Al_xGa_yIn_zN$ ($0 \leq x,y,z \leq 1$, $x+y+z=1$) have been used for forming a barrier layer such as n-type clad layer in a semiconductor light-emitting device of emitting visible light at a short wavelength in the blue or green band (see, for example, Isamu Akasaki, III-V Zoku Kagobutsu Handoutai (Group III-V Compound Semiconductor), 1st ed., Chap. 13, Baifukan (May 20, 1994)). Also, in an example of a high electron mobility field-effect transistor, the electron supply layer is constituted by an n-type aluminum-gallium nitride (compositional formula: $Al_xGa_yN$, wherein $0 \leq X \leq 1$) (see, for example, the above document). A semiconductor light-emitting device such as light-emitting diode (English abbreviation: LED) and laser diode (English abbreviation: LD) is produced by providing an n-type ohmic contact electrode (n-type ohmic electrode) which contacts with the surface of the above-described n-type Group III nitride semiconductor layer. A field-effect transistor (English abbreviation: FET) is produced by providing an n-type ohmic electrode which, for example, direct contacts with the surface of an electron supply layer or active layer comprising an n-type Group III nitride semiconductor.

As for the n-type ohmic electrode used with an n-type Group III nitride semiconductor, constituting the n-type ohmic electrode from, for example, titanium (atomic symbol: Ti) (see, for example, Japanese Patent No. 2783349) or aluminum (atomic symbol: Al) (see, for example, Unexamined Published Japanese Patent Application No. 7-45867) has been heretofore disclosed.

However, the compound semiconductor LED obtained by providing a conventional n-type ohmic electrode made of a metal material on an n-type Group III nitride semiconductor layer is demanded to have the lower forward voltage (so-called Vf). Also, an FET is demanded to have the lower drain resistance so as to prevent the device properties from deterioration due to an increase in thermal resistance. Accordingly, for enhancing the properties of a compound semiconductor light-emitting device or FET, the n-type ohmic electrode must be made of a material having a low contact resistance with the n-type Group III nitride semiconductor. The present invention provides, particularly, an n-type ohmic electrode for enhancing the properties of a compound semiconductor light-emitting device and also provides a compound light-emitting device equipped with the electrode and a method for forming the n-type ohmic electrode.

DISCLOSURE OF INVENTION

In order to solve the above-described problems, the present invention comprises the following constitutions.

(1) An n-type ohmic electrode for use with an n-type Group III nitride semiconductor, which is provided to contact with the surface of an n-type Group III nitride semiconductor layer, wherein the n-type ohmic electrode layer is made of an alloy of aluminum (atomic symbol: Al) and lanthanum (atomic symbol: La) or comprises lanthanum.

(2) The n-type ohmic electrode, as described in (1) above, wherein the lanthanum content in the n-type ohmic electrode layer is 10 mass % or more on the surface contacting with the n-type Group III nitride semiconductor layer.

(3) The n-type ohmic electrode, as described in (2) above, wherein the lanthanum content in the n-type ohmic electrode layer is less than 10 mass % in the region 30 nm or more distant from the junction interface with the n-type Group III nitride semiconductor layer.

(4) The n-type ohmic electrode, as described in (3) above, wherein the surface of the n-type ohmic electrode layer opposite the surface contacting with the n-type Group III nitride semiconductor layer is made of aluminum.

(5) A semiconductor light-emitting device fabricated by providing an ohmic contact electrode on a stacked structure body in which an n-type Group III nitride semiconductor layer and a p-type compound semiconductor layer are provided on one surface of a crystalline substrate and a light-emitting layer is interposed between the n-type and p-type compound semiconductor layers, wherein the n-type ohmic electrode provided to contact with the n-type Group III nitride semiconductor layer is made of a lanthanum-aluminum alloy layer or a lanthanum layer.

(6) The semiconductor light-emitting device as described in (5) above, wherein the n-type ohmic electrode comprises a lanthanum-aluminum alloy layer or a lanthanum layer in the side contacting with the n-type Group III nitride semiconductor layer and comprises an aluminum layer in the opposite side.

(7) The semiconductor light-emitting device as described in (5) or (6) above, wherein the n-type ohmic electrode comprises a lanthanum-aluminum alloy layer having a lanthanum content of 10 mass % or more at the junction interface with the n-type Group III nitride semiconductor layer and having a lanthanum content of less than 10 mass % in the region 30 nm or more distant from the junction interface.

(8) A method for forming an n-type ohmic electrode, comprising forming a lanthanum-aluminum alloy layer constituting the n-type ohmic electrode, by using a lanthanum-dialuminum alloy (compositional formula: $LaAl_2$) as a raw material.

(9) The method for forming an n-type ohmic electrode as described in (8) above, wherein the lanthanum-aluminum alloy layer is provided to join it to the surface of an n-type Group III nitride semiconductor layer while setting the n-type Group III nitride semiconductor layer at 300° C. or less, thereby forming an n-type ohmic electrode from a lanthanum-aluminum alloy layer having a lanthanum content of 10 mass % or more at the junction interface and having a lanthanum content of less than 10 mass % in the region 30 nm or more distant from the junction interface.

(10) A method for producing a semiconductor light-emitting device, comprising providing an ohmic contact electrode on a stacked structure body in which an n-type Group III nitride semiconductor layer and a p-type compound semiconductor layer are provided on one surface of a crystalline substrate and a light-emitting layer is interposed between the n-type and p-type compound semiconductor layers, wherein the lanthanum-aluminum alloy layer constituting an n-type ohmic electrode which contacts with the n-type Group III nitride semiconductor layer is formed by using a lanthanum-dialuminum alloy (compositional formula: $LaAl_2$) as a raw material.

(11) The method for producing a semiconductor light-emitting device as described in (10) above, wherein the lanthanum-aluminum alloy layer is provided to join it to the surface of the n-type Group III nitride semiconductor layer while setting the n-type Group III nitride semiconductor layer at 300° C. or less, thereby forming an n-type ohmic electrode from a lanthanum-aluminum alloy layer having a lanthanum content of 10 mass % or more at the junction interface and having a lanthanum content of less than 10 mass % in the region 30 nm or more distant from the junction interface.

According to the present invention, the n-type ohmic electrode provided to contact with the surface of the n-type Group III nitride semiconductor layer comprises an alloy of aluminum and lanthanum, so that an electrode having a low contact resistance can be formed and the device driving current supplied can be efficiently converted for the light emission, as a result, a compound semiconductor light-emitting device having high emission intensity can be provided.

MODE FOR CARRYING OUT THE INVENTION

Figure 1:
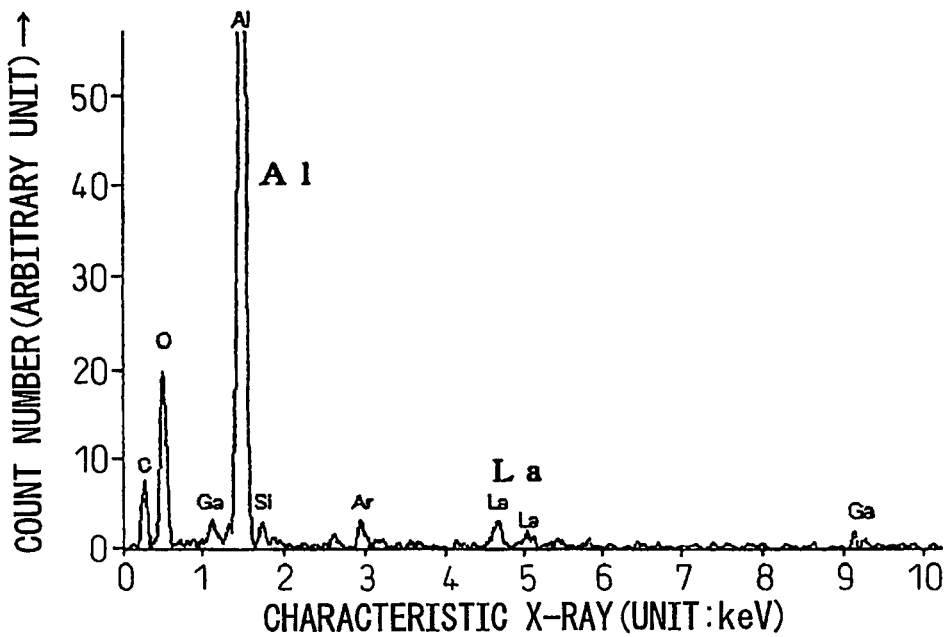
FIG. 1
A view showing the elemental analysis results of the lanthanum-aluminum layer described in Example 1.

The n-type Group III nitride semiconductor layer on which the n-type ohmic electrode is provided can be formed by a halogen process, a hydride process or an MOCVD (metal-organic chemical vapor deposition) process and can be also formed by a molecular beam epitaxial process (see, *J. Solid State Chem.*, pp. 269-272, 133 (1997)). The carrier concentration of the n-type Group III nitride semiconductor layer is suitably $1 \times 10^{18}$ cm$^{-3}$ or more, and the resistivity (specific resistance) is suitably $5 \times 10^{-2}$ Ω·cm or less. The thickness of the n-type Group III nitride semiconductor layer is suitably 50 nm or more where a continuous film can be obtained, and 5,000 nm or less where remarkable cracking is not generated. The carrier concentration is preferably nearly constant in the thickness direction of the n-type Group III nitride semiconductor layer or increases toward the surface of the layer.

The n-type ohmic electrode made of a lanthanum-aluminum alloy according to the present invention can be formed by using, as the raw material, a lanthanum-aluminum alloy represented, for example, by the compositional formula $LaAl_4$ (lanthanum content=56.3 mass %), $LaAl_2$ (lanthanum content=73.0 mass %) or LaAl (lanthanum content=83.7 mass %). In particular, the lanthanum-dialuminum alloy (compositional formula: $LaAl_2$) has a large lanthanum content as compared with $LaAl_4$ and has a melting point enabling satisfactory vapor deposition by a normal vacuum vapor deposition technique and therefore, this alloy can be used as an especially suitable raw material. LaAl has a high lanthanum content as compared with $LaAl_2$ but, similarly to trilanthanum-dialuminum (compositional formula: $La_3Al_2$), this alloy cannot form a lanthanum-aluminum alloy film stabilized in the compositional ratio between lanthanum and aluminum.

In order to form an n-type ohmic electrode having good contacting property, it is not necessary to heat the n-type Group III nitride semiconductor layer during the deposition of the raw material alloy. The temperature of the Group III nitride semiconductor layer during the deposition of the raw material alloy is suitably 50° C. or less. If the electrode is formed by heating the n-type Group III nitride semiconductor layer to a temperature exceeding 300° C., a lanthanum-aluminum alloy layer having a small lanthanum content at the junction interface with the n-type semiconductor layer is disadvantageously formed. As the lanthanum-aluminum alloy layer formed has a smaller lanthanum content in the region near the junction interface, the contact resistance of the n-type ohmic electrode increases. If the lanthanum content of the lanthanum-aluminum alloy layer in the region near the junction interface is less than 10 mass %, an n-type ohmic electrode having a contact resistance of 0.1 Ω·cm$^{-2}$ or less cannot be stably formed. Also, an aluminum-lanthanum alloy layer containing 10 mass % or more of lanthanum is preferably provided in the region of 30 nm or less from the junction interface with the n-type Group III nitride semiconductor layer toward the surface of the alloy layer. On the contrary, in the region 30 nm or more distant from the junction interface, the lanthanum content is preferably less than 10 mass %. The layer contacting with the surface of the n-type Group III nitride semiconductor layer may be made of a simple lanthanum substance, that is, may be a layer having a lanthanum mass content of 100 mass %.

The lanthanum-aluminum alloy constituting the n-type ohmic electrode is suitably deposited to a thickness large enough to gaplessly coat the surface of the n-type Group III nitride semiconductor layer. In general, the raw material alloy is suitably deposited to a thickness of 50 nm or more. In the case of constituting a pad electrode for wire bonding, a metal film is further superposed on the lanthanum-aluminum alloy film. The metal film provided to join with the lanthanum-aluminum alloy film contacting with the surface of the n-type Group III nitride semiconductor layer is preferably made of aluminum or titanium. The thickness of the pad electrode is suitably from about 1 μm to about 5 μm. For example, an Al film having a thickness of about 1.5 μm may be provided and joined with an $LaAl_2$ alloy film having a thickness of 0.3 μm to constitute a pad electrode having a total thickness of 1.8 μm. For constituting a good n-type ohmic electrode, it is not preferred to deposit, for example, an aluminum layer on the lanthanum-aluminum alloy layer and then apply an alloying treatment at a temperature exceeding 300° C. It is because that the thermal diffusion of lanthanum due to the high-temperature heat treatment prevents the lanthanum element from accumulating in the desired region in the vicinity of junction interface with the n-type Group III nitride semiconductor layer.

The lanthanum-aluminum alloy film provided to contact with the surface of the n-type Group III nitride semiconductor layer has an activity of giving an n-type ohmic electrode having a low contact resistance.

EXAMPLES

Example 1

The present invention is described in greater detail below by referring to the case where an n-type ohmic electrode comprising a lanthanum-aluminum alloy film is provided on the surface of an n-type Group III nitride semiconductor layer.

An n-type GaN layer doped with silicon (Si) was vapor deposited by reduced-pressure MOCVD using trimethylgallium (molecular formula: $(CH_3)_3Ga$) and ammonia (molecular formula: $NH_3$) as raw materials. The carrier concentration of the n-type GaN layer was $9 \times 10^{19}$ cm$^{-3}$ and the layer thickness was about 3.2 μm. After treating the GaN layer surface with an aqueous ammonium fluoride ($NH_4F$) solution, a lanthanum-aluminum alloy film was deposited on the surface.

While keeping the n-type GaN layer at room temperature (up to 23° C.), a lanthanum-aluminum alloy layer was deposited on the GaN layer surface by a normal vacuum vapor deposition method using an $LaAl_2$ alloy as the vapor deposition source. The lanthanum-aluminum alloy was deposited to a thickness of about 0.5 μm. FIG. 1 shows the results of elemental analysis in the junction region between the n-type GaN layer and the lanthanum-aluminum alloy layer, measured by using an energy dispersion-type X-ray microanalyzer (EDX) appended to an electron microscope. The analysis results reveal that, by depositing the lanthanum-aluminum alloy layer on the GaN layer at room temperature, a lanthanum-aluminum alloy layer containing lanthanum as much as about 15 mass % in the region near the junction interface with the n-type GaN layer was formed. Also, the region where a lanthanum-aluminum alloy contains lanthanum in excess of 10 mass % was a region of about 8 nm from the junction interface with the n-type GaN layer toward the surface side of the alloy layer. In the region closer than that to the surface side of the alloy layer, the lanthanum content was decreased from 10 mass % with an increase in the thickness of the alloy layer. The surface region of the alloy layer contained almost no lanthanum and was mainly composed of aluminum.

Figure 2:
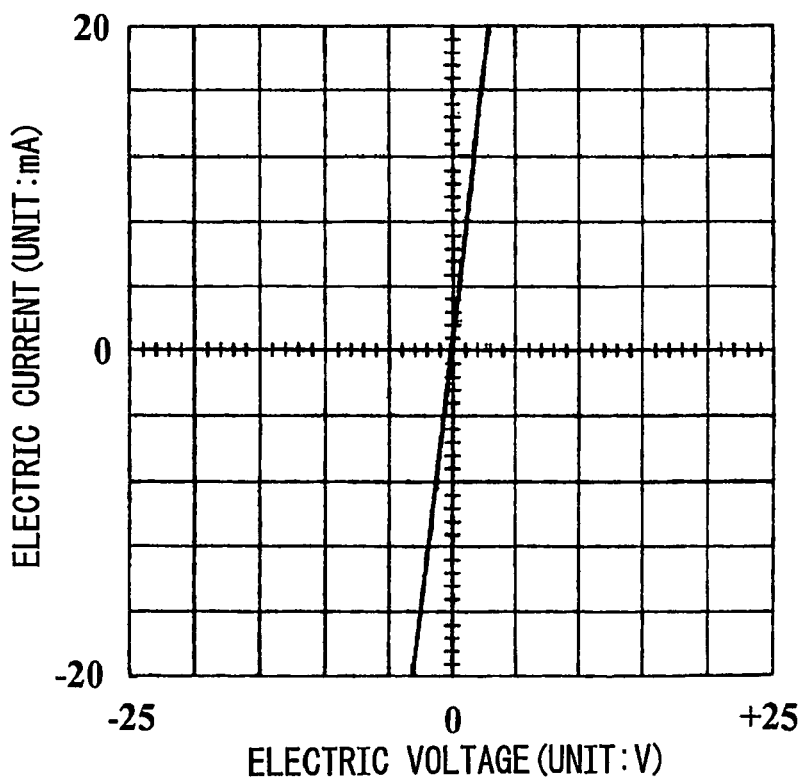
FIG. 2
A view showing the current-voltage characteristics of the electrode described in Example 1.

FIG. 2 shows the current-voltage (I-V) characteristics between electrodes, composed of lanthanum-aluminum alloy films, formed in proximity to each other on the surface of the above n-type GaN layer. In the positive and negative low voltage region of ±50 mV, the current is linearly increasing in direct proportion to the voltage. Also, in the voltage region of ±5 V or less, the current linearly increases according to the increase of voltage applied. From these I-V characteristics, it is revealed that a good n-type ohmic electrode for the n-type GaN layer was formed by the lanthanum-aluminum alloy layer.

Figure 3:
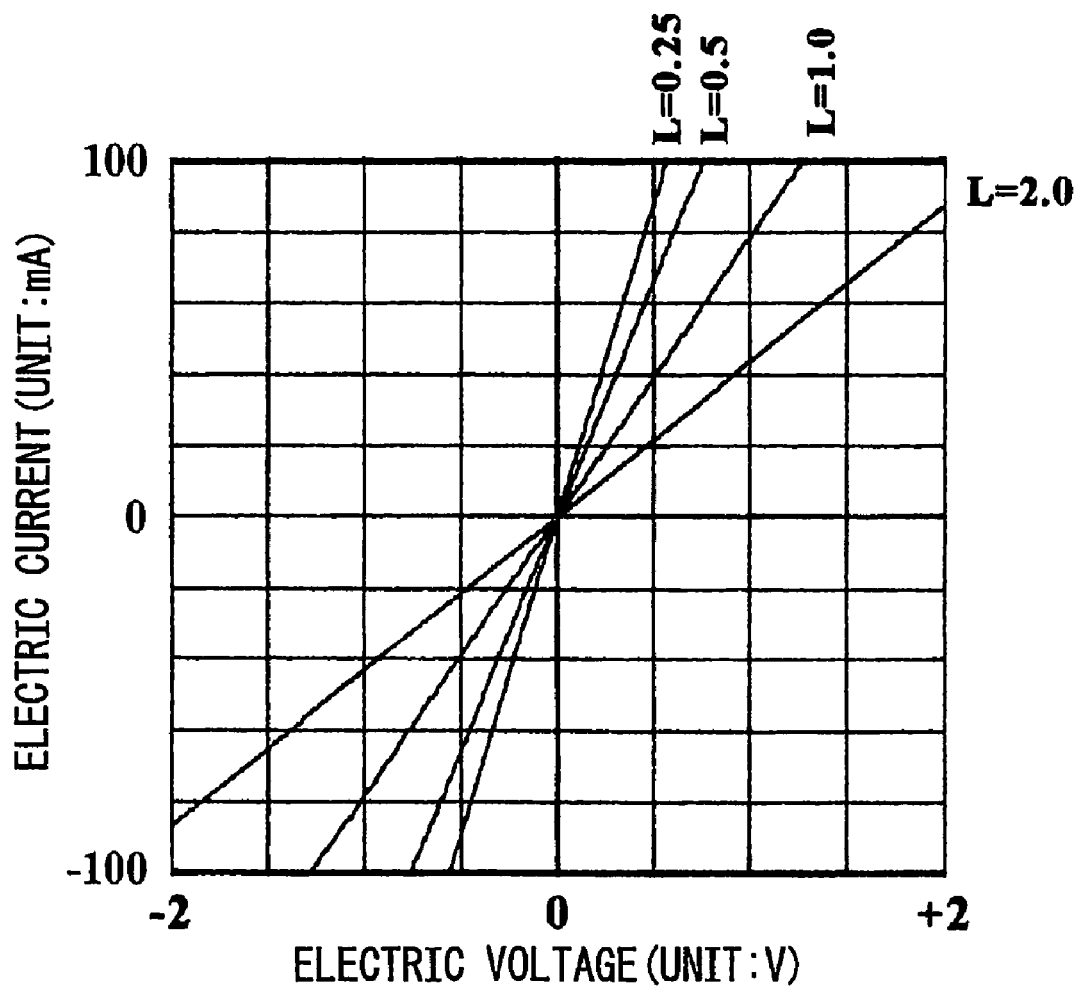
FIG. 3
A view showing the change in the current-voltage characteristics depending on the distance (L) between electrodes described in Example 1.

FIG. 3 shows the I-V characteristics measured by variously changing the distance (L) between the lanthanum-aluminum alloy electrodes to 0.25 mm, 0.50 mm, 1.0 mm or 2.0 mm. The electrode distance dependency of resistance value was determined from the I-V characteristics and the contact resistance calculated therefrom according to the theory of TLM (transmission line mode) was $1.6 \times 10^{-2}$ Ω·cm$^{-2}$. In this calculation, the electrode width actually effective for passing the current was taken into consideration.

Example 2

Figure 4:
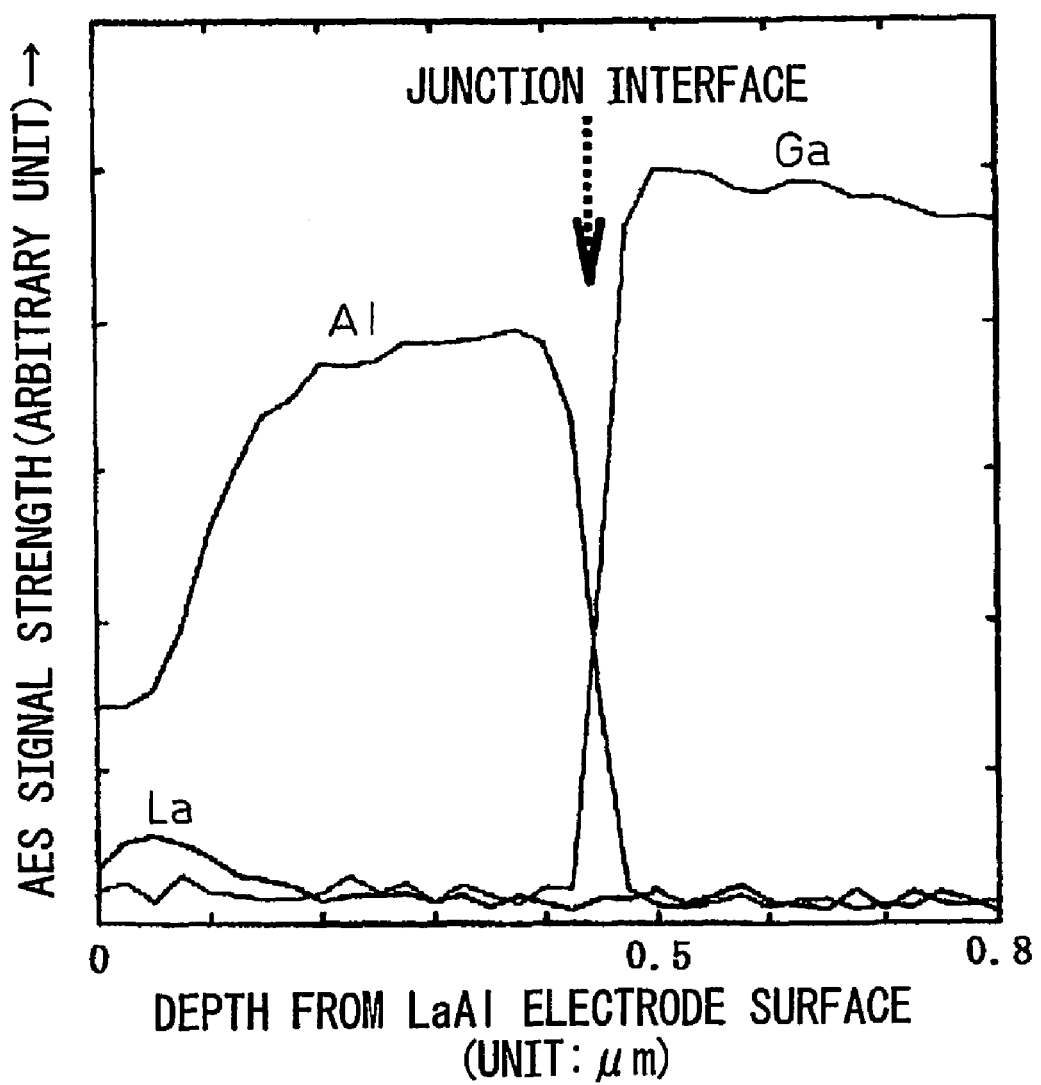
FIG. 4
A view showing an element distribution inside the lanthanum-aluminum alloy layer deposited at a high temperature described in Example 2.

While keeping the above n-type GaN layer at 350° C., a lanthanum-aluminum alloy layer was deposited on the surface of the GaN layer. The lanthanum-aluminum alloy layer was formed by changing only the temperature at the deposition from that in Example 1. FIG. 4 shows the results of Auger electron spectroscopic analysis of the lanthanum-aluminum alloy layer. Since the alloy source ($LaAl_2$) of the lanthanum-aluminum alloy layer was deposited at a high temperature, lanthanum was accumulated in the surface layer region of the alloy layer. On the other hand, the region near the junction interface with the n-type GaN layer, and at least the region within 30 nm from the junction interface toward the alloy layer side, contained almost no lanthanum, and this was a layer having a lanthanum mass content of less than 5% and mainly comprising aluminum.

Figure 5:
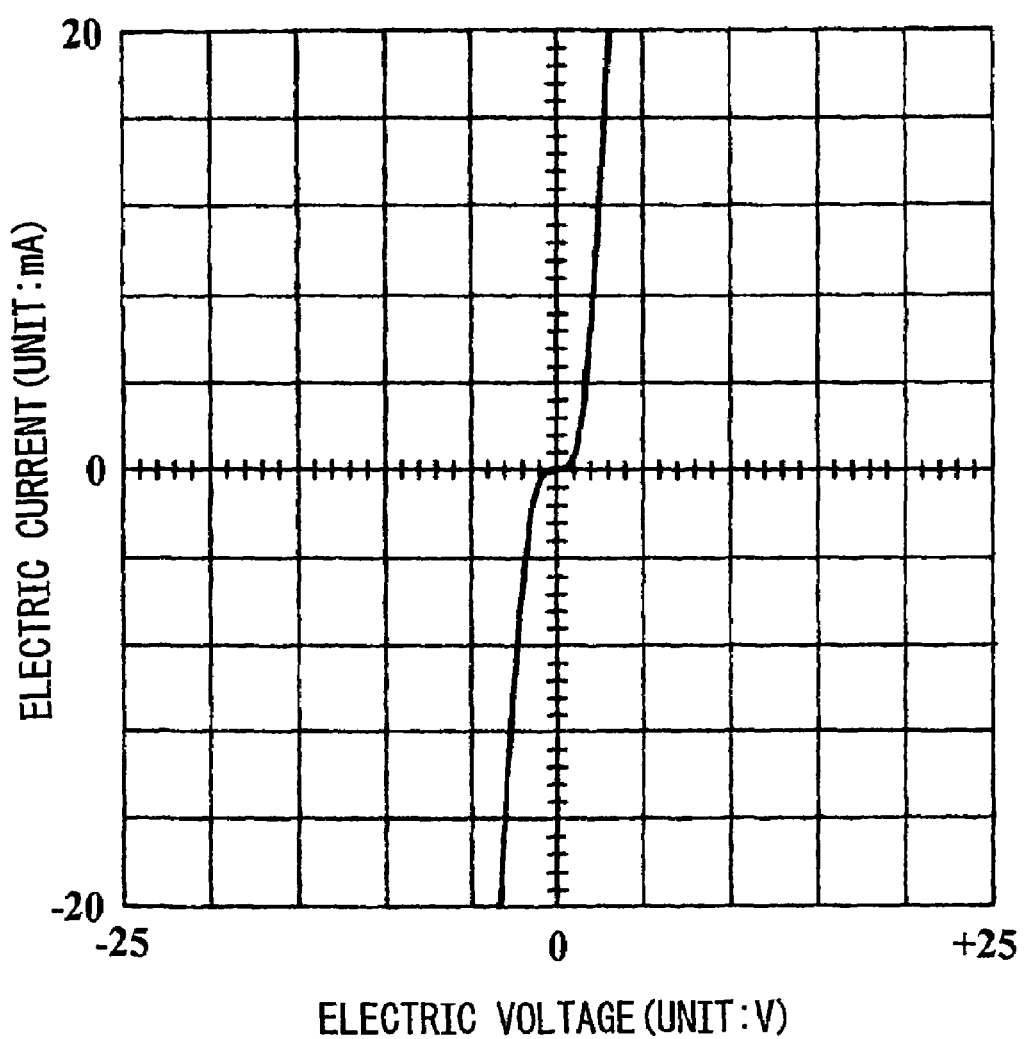
FIG. 5
A view showing the current-voltage characteristics of the lanthanum-aluminum alloy layer described in Example 2.

FIG. 5 shows the I-V characteristics of the lanthanum-aluminum alloy layer deposited at a high temperature. As seen from the I-V characteristics, high resistance was already generated in the low voltage region of ±1 V. When compared with the I-V characteristics of the lanthanum-aluminum alloy layer deposited at room temperature shown in FIG. 2, it is revealed that the lanthanum-aluminum alloy film formed at a high temperature of this Example gave an n-type ohmic electrode inferior to that of Example 1 in the ohmic properties for the n-type GaN layer. The I-V characteristics showing a similar non-rectifying property appeared outstandingly when the lanthanum-aluminum alloy layer was formed at a high temperature exceeding 300° C.

Example 3

The present invention is described in greater detail below by referring to the case where a compound semiconductor LED is fabricated by using an n-type ohmic electrode made of a lanthanum-aluminum alloy.

Figure 6:
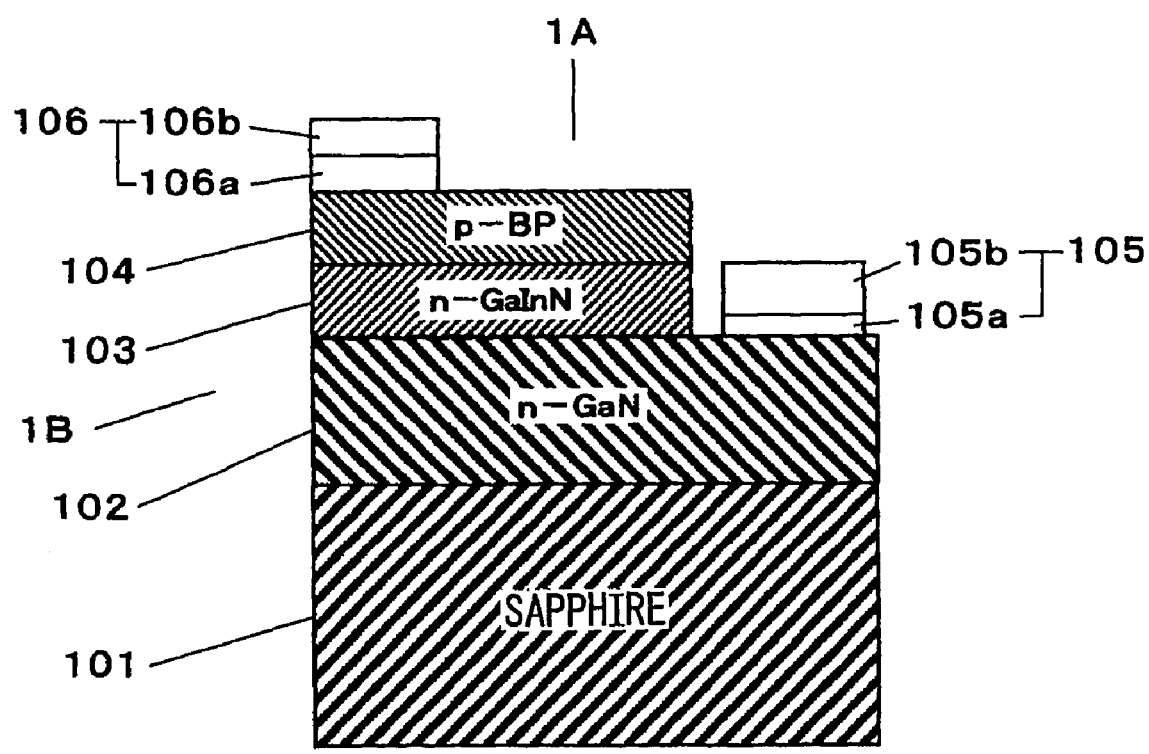
FIG. 6
A cross-sectional schematic view of LED described in Example 3.
Figure 7:
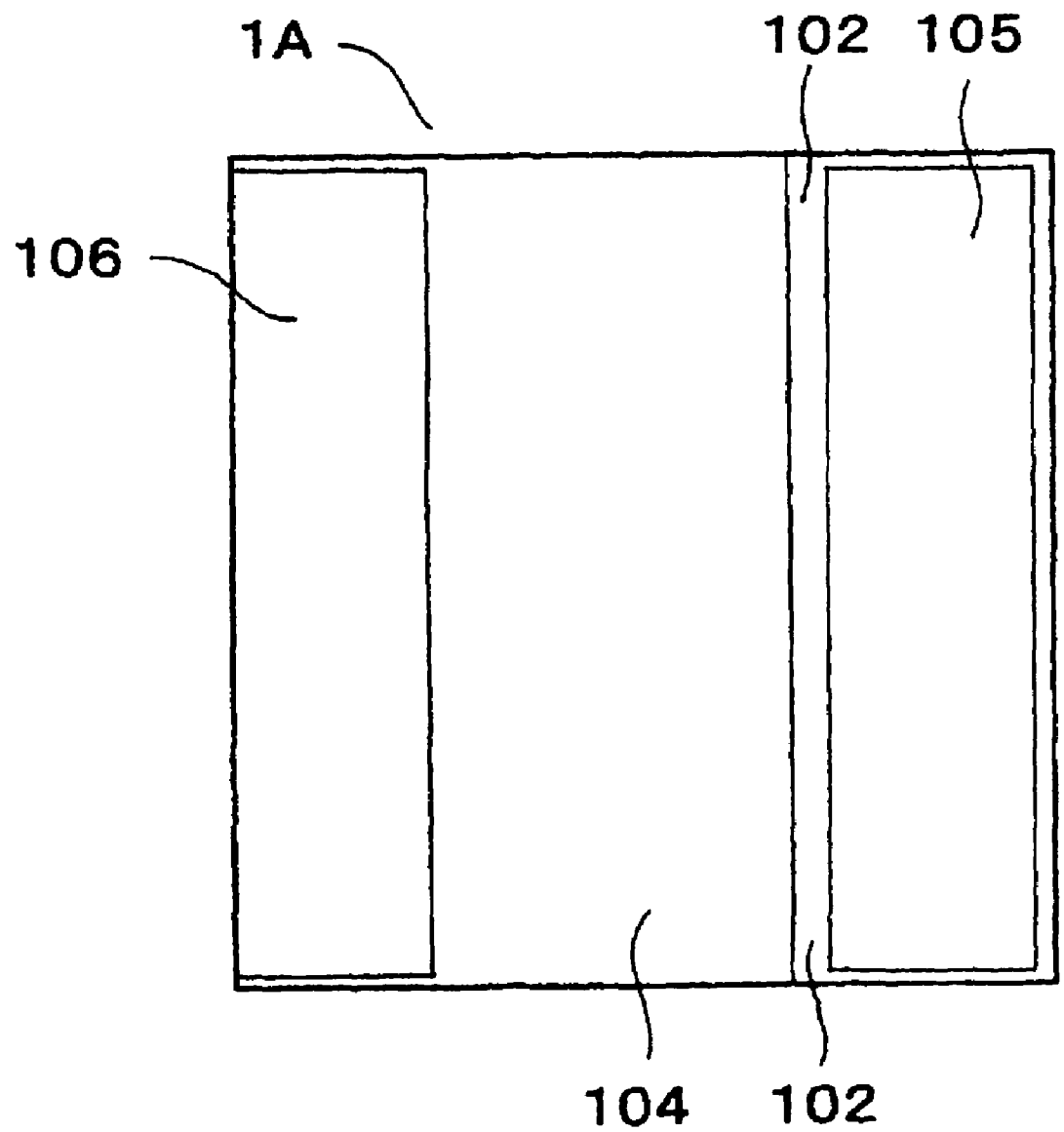
FIG. 7
A plan schematic view of LED shown in FIG. 6.

FIG. 6 shows a cross-sectional schematic view of LED 1A of this Example. Also, FIG. 7 shows a plan schematic view of LED 1A.

On a (0001)-sapphire ($Al_2O_3$) substrate 101, an Si-doped n-type GaN layer (carrier concentration=$6 \times 10^{18}$ cm$^{-3}$, thickness=4.2 μm) 102, an n-type gallium indium nitride ($Ga_{0.90}In_{0.10}N$) light-emitting layer 103 having a multiphase structure comprising multiple domains or phases differing from each other in the indium (In) compositional ratio, and an undoped p-type boron phosphide (BP) layer (carrier concentration=$1 \times 10^{19}$ cm$^{-3}$, thickness=0.6 μm) 104 were sequentially stacked to constitute a stacked structure body 1B.

Subsequently, the p-type BP layer 104 serving as the outermost layer of the stacked structure body 1B was subjected to patterning by using a known photolithography technique and then processed into a device shape by a general plasma etching method using chlorine gas ($Cl_2$). By this processing, a partial region of the p-type BP layer 104 was removed as shown in FIGS. 6 and 7. On the surface of the n-type GaN layer 102 exposed by the plasma etching, a lanthanum-aluminum alloy layer 105a and an aluminum layer 105b were continuously deposited by a known vacuum vapor deposition technique. Thereafter, by patterning these superposed metal layers (105a and 105b), a rectangular n-type ohmic electrode 105 was formed. The lanthanum-aluminum alloy layer 105a was formed at room temperature on the n-type GaN layer 102 by using a lanthanum-aluminum alloy (LaAl$_2$) as the vapor deposition source, and the thickness of the lanthanum-aluminum alloy layer 105*a* was set to 100 nm. The thickness of the aluminum layer 105*b* was set to 1.5 μm. On the other hand, on the surface of the p-type BP layer, a p-type ohmic electrode 106 consisting of a multilayer structure of titanium (Ti) 106*a* and gold (Au) 106*b* deposited by an electron beam vapor deposition method was formed. These two ohmic electrodes 105 and 106 were not subjected to alloying.

To the thus-fabricated LED 1A having a double-hetero (DH) junction structure in which the n-type GaN layer 102 with the surface being a (0001) crystal plane served as a lower clad layer and the p-type (111)-BP layer 104 oriented to a (111) crystal orientation served as an upper clad layer, a device driving current was passed in the forward direction. When a forward current of 20 mA was passed between n-type and p-type ohmic electrodes 105 and 106, the light emission center wavelength was 440 nm. The forward voltage was 3.4 V and the reverse voltage with a reverse current of 10 μA was 8.3 V.

The invention claimed is:

1. An n-type ohmic electrode for use with an n-type Group III nitride semiconductor, which is provided to contact with the surface of an n-type Group III nitride semiconductor layer, wherein the n-type ohmic electrode layer is made of an alloy of aluminum (atomic symbol: Al) and lanthanum (atomic symbol: La) or comprises lanthanum, and wherein the lanthanum content in the n-type ohmic electrode layer is 10 mass % or more on the surface contacting with the n-type Group III nitride semiconductor layer.

2. The n-type ohmic electrode according to claim 1, wherein the lanthanum content in the n-type ohmic electrode layer is less than 10 mass % in the region 30 nm or more distant from the junction interface with the n-type Group III nitride semiconductor layer.

3. The n-type ohmic electrode according to claim 2, wherein the surface of the n-type ohmic electrode layer opposite the surface contacting with the n-type Group III nitride semiconductor layer is made of aluminum.

4. A semiconductor light-emitting device fabricated by providing an ohmic contact electrode on a stacked structure body in which an n-type Group III nitride semiconductor layer and a p-type compound semiconductor layer are provided on one surface of a crystalline substrate and a light-emitting layer is interposed between the n-type and p-type compound semiconductor layers, wherein the n-type ohmic electrode provided to contact with the n-type Group III nitride semiconductor layer is made of a lanthanum-aluminum alloy layer or a lanthanum layer, the n-type ohmic electrode comprises a lanthanum-aluminum alloy layer has a lanthanum content of 10 mass % or more at the junction interface with the n-type Group III nitride semiconductor layer and has a lanthanum content of less than 10 mass % in the region 30 nm or more distant from the junction interface.

5. The semiconductor light-emitting device according to claim 4, wherein the n-type ohmic electrode comprises a lanthanum-aluminum alloy layer or a lanthanum layer in the side contacting with the n-type Group III nitride semiconductor layer and comprises an aluminum layer in the opposite side.

6. A method for forming an n-type ohmic electrode for use with an n-type Group III nitride semiconductor, which is provided to contact with the surface of an n-type Group III nitride semiconductor layer, wherein the n-type ohmic electrode layer is made of an alloy of aluminum (atomic symbol: Al) and lanthanum (atomic symbol: La) or comprises lanthanum, and wherein the lanthanum content in the n-type ohmic electrode layer is 10 mass % or more on the surface contacting with the n-type Group III nitride semiconductor layer, which method comprises forming a lanthanum-aluminum alloy layer constituting the n-type ohmic electrode, by using a lanthanum-dialuminum alloy (compositional formula: LaAl$_2$) as a raw material.

7. The method for forming an n-type ohmic electrode according to claim 6, wherein the lanthanum-aluminum alloy layer is provided to join it to the surface of an n-type Group III nitride semiconductor layer while setting the n-type Group III nitride semiconductor layer at 300° C. or less, thereby forming an n-type ohmic electrode from a lanthanum-aluminum alloy layer having a lanthanum content of 10 mass % or more at the junction interface and having a lanthanum content of less than 10 mass % in the region 30 nm or more distant from the junction interface.

8. A method for producing a semiconductor light-emitting device fabricated by providing an ohmic contact electrode on a stacked structure body in which an n-type Group III nitride semiconductor layer and a p-type compound semiconductor layer are provided on one surface of a crystalline substrate and a light-emitting layer is interposed between the n-type and p-type compound semiconductor layers, wherein the n-type ohmic electrode provided to contact with the n-type Group III nitride semiconductor layer is made of a lanthanum-aluminum alloy layer or a lanthanum layer, the n-type ohmic electrode comprises a lanthanum-aluminum alloy layer has a lanthanum content of 10 mass % or more at the junction interface with the n-type Group III nitride semiconductor layer and has a lanthanum content of less than 10 mass % in the region 30 nm or more distant from the junction interface, which method comprises providing an ohmic contact electrode on a stacked structure body in which an n-type Group III nitride semiconductor layer and a p-type compound semiconductor layer are provided on one surface of a crystalline substrate and a light-emitting layer is interposed between the n-type and p-type compound semiconductor layers, wherein the lanthanum-aluminum alloy layer constituting an n-type ohmic electrode which contacts with the n-type Group III nitride semiconductor layer is formed by using a lanthanum-dialuminum alloy (compositional formula: LaAl$_2$) as a raw material.

9. The method for producing a semiconductor light-emitting device according to claim 8, wherein the lanthanum-aluminum alloy layer is provided to join it to the surface of the n-type Group III nitride semiconductor layer while setting the n-type Group III nitride semiconductor layer at 300° C. or less, thereby forming an n-type ohmic electrode from a lanthanum-aluminum alloy layer having a lanthanum content of 10 mass % or more at the junction interface and having a lanthanum content of less than 10 mass % in the region 30 nm or more distant from the junction interface.

* * * * *

UNITED STATES PATENT AND TRADEMARK OFFICE
CERTIFICATE OF CORRECTION

| | |
|---|---|
| PATENT NO. | : 7,598,593 B2 |
| APPLICATION NO. | : 10/561438 |
| DATED | : October 6, 2009 |
| INVENTOR(S) | : Takashi Udagawa |

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 886 days.

Signed and Sealed this

Twenty-eighth Day of September, 2010

David J. Kappos
*Director of the United States Patent and Trademark Office*